United States Patent [19]

Lincoln

[11] Patent Number: 5,438,599
[45] Date of Patent: Aug. 1, 1995

[54] SELF-CALIBRATION TIMING CIRCUIT

[75] Inventor: Daniel J. Lincoln, Bowie, Md.

[73] Assignee: LSI Logic Corporation, Milpitas, Calif.

[21] Appl. No.: 129,913

[22] Filed: Sep. 30, 1993

[51] Int. Cl.[6] .............................................. H03D 3/02
[52] U.S. Cl. ................................... 377/20; 324/76.62; 324/76.64; 324/76.82; 327/42; 327/40
[58] Field of Search .......................... 328/61, 133-134, 328/140; 331/1 A, 111; 307/271, 525-526; 324/76.62-76.64, 76.82; 377/20

[56] References Cited

U.S. PATENT DOCUMENTS

4,616,173  10/1986  Cook et al. ...................... 324/76.62
4,993,052   2/1991  Hammelsbacher ................. 328/140

*Primary Examiner*—Margaret R. Wambach
*Attorney, Agent, or Firm*—Honigman Miller Schwartz and Cohn

[57] ABSTRACT

A method and apparatus for a "self-calibration timing circuit" is utilized to dynamically compensate for inherent performance differences between individual semiconductor dice, and for a wide range of different operating temperature and voltage parameters. The present invention accomplishes this by utilizing circuits which are deposed on the semiconductor die. These circuits consist of a relaxation oscillator running at the natural frequency of the silicon die, a gated counter counting the number of cycles of the relaxation oscillator frequency during a reference clock period to produce a ratio thereof, and a decision circuit that utilizes this ratio to optimize a system clock frequency for best system operation.

22 Claims, 6 Drawing Sheets

SELF-CALIBRATION TIMING CIRCUIT

BACKGROUND OF THE INVENTION

1. Field of the Invention

The present invention relates to semiconductor integrated circuits and, more particularly, to a method and apparatus for self-calibrating timing circuits thereof.

2. Description of the Related Technology

Semiconductor integrated circuits are fabricated on, for example, a silicon wafer and may have a wide variance in speed of operation. Performance, even among the same type of integrated circuit, may vary widely in operational speed performance after layout by a factor of as much as 375 percent from slowest to fastest operating speed. This wide range of operating speeds results from process lot variations during fabrication of the integrated circuit wafer and resulting dice, variations in temperature and operating voltage of the integrated circuit dice during operation in a system.

Such wide variance in operating speed range typically causes design problems in timing between different devices such as set up and hold requirements and maximum clock speed. System circuit designs must take into account worst-case operating voltage and temperature characteristics of the integrated circuits utilized. Manufacturers must guarantee operating parameters that may be much less than actual products are capable of performing because worst-case conditions must be met. This results in a loss of circuit performance because operating parameters for worst-case conditions must always be maintained.

What is needed is a method and apparatus which automatically and continuously senses the relative performance of the integrated circuit during operation, and allows the operating speed of the circuit to be adjusted for best performance. It is, therefore, an object of the present invention to "self-calibrate" optimal performance parameters during operation over a wide range of temperatures and voltages encountered, and to compensate for operating parameter differences between integrated circuits resulting from variations during the fabrication process or in system operation.

SUMMARY OF THE INVENTION

The present invention provides a method and apparatus for a "self calibration timing circuit" which may be utilized for dynamic compensation of inherent performance differences within individual integrated circuits over the entire range of operating conditions. The present invention accomplishes this by utilizing circuits which reside on the integrated circuit die of interest. The present invention consists of a relaxation oscillator, a gated counter, a fixed reference oscillator and a decision circuit for determining the current operating point.

Implementation of the present invention on the semiconductor integrated circuit die allows automatic and continuous sensing of the relative performance of the die and allows appropriate compensation of the circuit parameters to be applied in real time. This compensation may be applied to circuits where combinational signals have a controlled range of minimum and maximum propagation times from input to output or to propagation times within the die itself.

A self-timed circuit may be utilized to operate the individual die as fast as it is capable of operating. This may be implemented with a circuit that controls an internal frequency source, such as a voltage controlled oscillator, to operate the die at the highest internal frequency that still provides stable and reliable operation. Other and further circuits may readily incorporate the present invention and will be appreciated by those skilled in the art of electronic integrated circuit design.

The performance of several types of semiconductor device technologies varies with operating temperature. For those applications where performance is critical, it is advantageous to maintain the semiconductor device at an optimal temperature by means of thermal devices adapted to heat or cool the silicon wafer. Thermally controlling the operating temperature of the device enables better performance over greater temperature margin. Thermoelectric or "Peltier" heat pumps may be utilized to control the temperature of the device. Thermoelectric heat pumps are manufactured by Melcor, 1040 Spruce Street, Trenton, N.J. 08648; and Marlow Industries, Inc., 10451 Vista Park Road, Dallas, Tex. 75238-1645.

In a preferred embodiment of the present invention, a reference generator oscillates at the free running or relaxation frequency of the silicon die which is the natural speed of the silicon in the environment. The relaxation frequency is determined by the inherent propagation delays and device parameters of the silicon die embodied transistor circuits.

An initialization circuit is utilized to synchronize the reference generator and an external or internal system clock to a gated counter which is utilized for the purpose of quantizing the ratio of the reference generator frequency to the system clock frequency. The gated counter counts the number of relaxation frequency cycles during one or more system clock periods. Since the gated counter is synchronized by the fixed external system clock, an accurate and repeatable count is made. The ratio is the number of reference generator cycles counted during the one or more system clock periods. As an example, ten reference generator cycles counted during one system clock period will result in a ratio of 10.

The quantized value of the ratio of reference generator to system clock frequencies is then utilized to determine the speed at which the semiconductor die is capable of reliably running, based upon technology library parameters and device layout. It is important to note that with well characterized library elements and accurate back-annotation from layout design, the range of expected relaxation frequencies can be accurately anticipated for any generic semiconductor technology. Thus, the present invention may be applied without requiring the creation of special functional cells.

With this information, the system clock may be varied for optimum system performance and reliability. Through circuit testing and/or computer simulations, an optimal ratio for best circuit performance and reliability may be easily obtained. From this optimal ratio, better control of circuit performance and reliability may be derived for all temperature, voltage and fabrication process variations.

In one aspect of the invention, a decision circuit evaluates the quantized ratio of the reference generator to system clock frequencies and determines if the integrated circuit die is capable of operating at a faster clock speed or should be restricted to a slower clock speed. The decision circuit looks for a maximum ratio when the system clock is at its slower clock speed, and looks for a minimum ratio when the clock is at its faster speed. In this way, the system clock speed cannot exceed the speed capabilities of the silicon die, yet a substantial part of the die's performance may still be utilized.

In another aspect, a multiple speed system clock may be derived from a voltage controlled oscillator system or from the output of a programmable frequency divider dividing down a high frequency clock. A fixed frequency comparison clock is utilized to gate the counter which counts the number of relaxation oscillator cycles during one or more comparison clock periods. The number of cycles counted during the gate period is utilized to determine the appropriate speed of the system clock. Operation over multiple clock speeds is possible by utilizing a look up table having a range of system parameters correlating die operating speed with different system clock speeds.

Quantized ratio values may be obtained from the outputs of the gated counter. The gated counter may be, for example, a binary ripple counter consisting of ripple connected D flip-flops of sufficient number to store the maximum count ratio anticipated. The Q-outputs of these D flip-flops may be parallel loaded into a register during an alternate system clock period from the one in which the gated counter is quantizing the ratio of the two clock frequencies.

An advantage of the present invention is that a semiconductor integrated circuit such as a microprocessor may run as fast as possible without having to maintain a slow speed based upon an expected worst-case environment. The faster the microprocessor runs, the faster the software system performs its functions. Thus, for a given environment, a computer system may have higher performance at lower cost than is presently possible.

Another advantage is that a computer system may be run at greater speeds when the environment allows an increase in system speed. As an example, in space satellites and space craft, extreme temperature ranges from extremely cold to very hot are encountered. A silicon based complementary metal oxide semiconductor ("CMOS") device cannot reliably run as fast when warm as when cold, thus a speed reduction of the system clock is appropriate for proper operation when the semiconductor device is warm.

Heretofore, the system clock had to substantially remain at the lower speed setting throughout the extremes of temperature found in outer space. The present invention allows a system speed improvement at least as large as the silicon speed range. A plurality of semiconductor integrated circuit devices all could have the present invention integrated therein, and the ratios of each device utilized to optimize the performance of the total system.

A feature of the present invention is that the ratio may be utilized to sort out different grades of semiconductor devices during testing based on speed of operation. The relaxation oscillator need only be implemented on the semiconductor die, the gated counter, and speed decision circuitry may be implemented in the test system.

Another feature is for indicating die device speed values for adjusting interface timing parameters for proper operation between different speed devices.

Still another feature is to monitor the performance of the semiconductor device during operation in a system over a wide range of operating conditions. Deviation from an expected norm may be predictive of device degradation or devices beyond the desired tolerance range.

Other and further objects, features and advantages will be apparent from the following description of presently preferred embodiments of the invention, given for the purpose of disclosure and taken in conjunction with the accompanying drawings.

DESCRIPTION OF A PREFERRED EMBODIMENT

Referring now to the drawings, the details of a preferred embodiment are schematically illustrated. Like elements are numbered the same, and similar elements are represented by the same number and a different lower case letter suffix.

Figure 1:
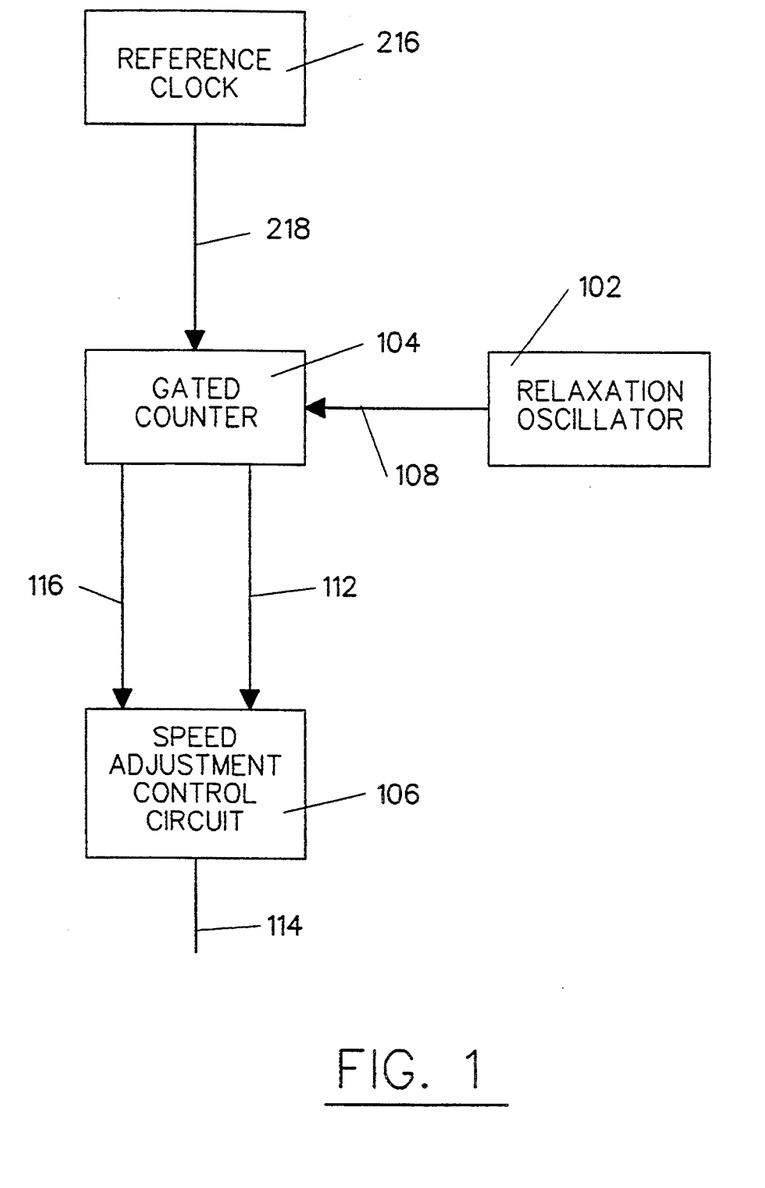
FIG. 1 is a block diagram of an embodiment of the present invention.

Referring now to FIG. 1, a block diagram of an embodiment of the present invention is illustrated. The present invention consists of a relaxation oscillator 102, a gated counter 104 and a speed adjustment control circuit 106. The relaxation oscillator 102 oscillates at the natural speed of the silicon in the environment in which it is fabricated and is additionally influenced by the associated connection path delays due to layout capacitance. An oscillator output 108 from the relaxation oscillator 102 connects to the count input of the gated counter 104. The counter also utilizes the system clock 110 as an input for synchronization and gating.

The gated counter 104 quantizes the ratio of the oscillator output 108 and reference clock 216 by counting the number of cycles of the oscillator output 108 during a period of the reference clock 216 frequency. As the natural speed of the silicon changes during environmental extremes such as hot to cold, the ratio will run from low to high, respectively. When the ratio is high, a high count signal 112 may be sent to the speed adjustment control circuit 106. Conversely, when the ratio is low, a low count signal 116 is sent to speed adjustment control circuit 106. Speed adjustment control circuit 106 may be utilized to control a system clock speed by means of speed adjustment output 114. When a high ratio, the system clock speed is increased and when a low ratio, the system clock speed is decreased. Signals 112 and 116 also allow the speed adjustment control circuit 106 to assert delay elements in a controlled manner to satisfy input setup and hold times for proper interface timing.

Multiple clock speeds may be controlled by monitoring multiple bits of information from the gated counter. The actual quantized ratio value may be read from the individual stage outputs (not illustrated) of the gated counter 104, and the ratio value may be utilized to determine the selection of an appropriate system clock speed.

Figure 2:
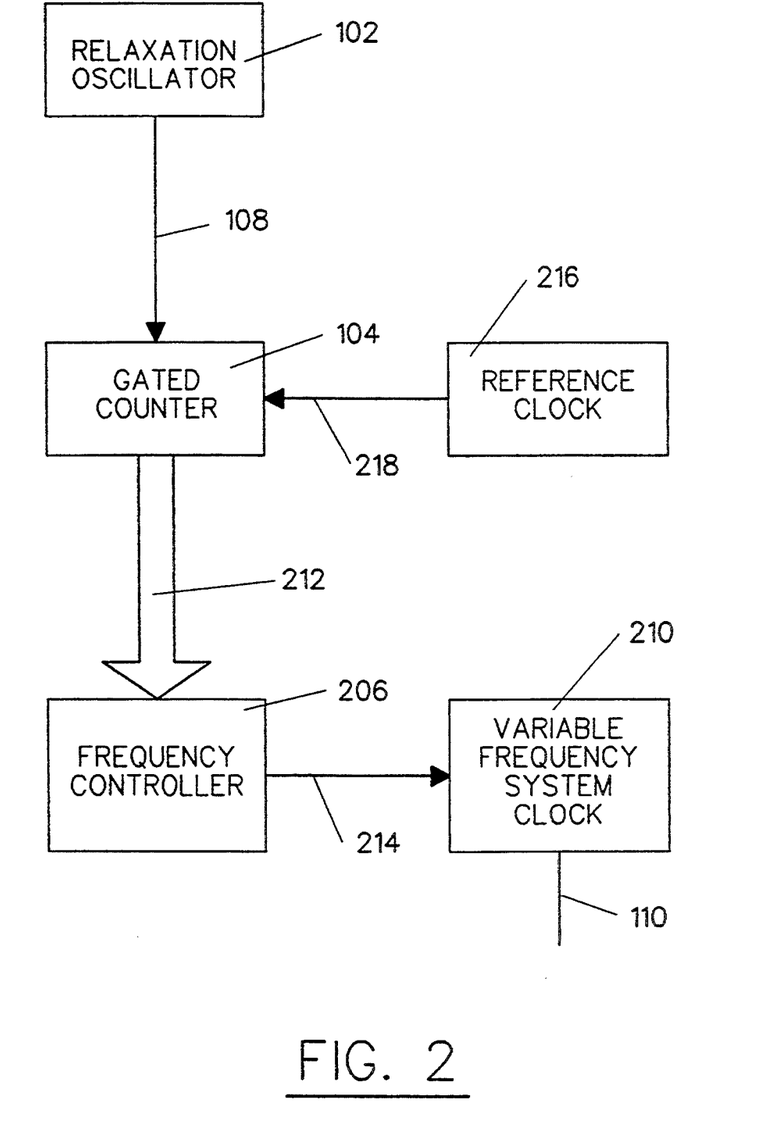
FIG. 2 is a block diagram of an embodiment of the present invention utilized in a system.

Referring now to FIG. 2, a block diagram of an embodiment of the present invention utilized in a system is illustrated. The relaxation oscillator 102 oscillator output 108 connects to the count input of the gated counter 104. A fixed frequency reference clock 216 is utilized as a time base reference for the gated counter 104. An output 218 of the reference clock 216 connects to the gated counter 104 for synchronization and gating thereof.

The gated counter 104 quantizes the ratio of the relaxation oscillator 102 and reference clock 216 frequencies by counting the number of cycles of the signal on relaxation oscillator output 108 during a period of the signal on output 218. The quantized ratio value is available on output bus 212. The output bus 212 connects to a frequency controller 206 which utilizes the quantized ratio to determine the optimal frequency of a variable frequency system clock 210.

The system clock 210 may utilize, for example, a phase lock loop, direct digital synthesis, programmable frequency division, or any other means for generating a variable frequency known by those skilled in the art of frequency generation techniques.

The frequency controller 206 controls the variable frequency system clock 210 through control signal 214. Frequency controller 206 causes the system clock 210 to change frequency based upon the quantized ratio on the output bus 212. Thereafter, the frequency controller 206 and system clock 210 may maintain the desired ratio throughout the temperature and voltage operating ranges of the system. In this way, the system always is maintained at optimal performance though extreme temperature and voltage variations encountered during operation.

Relaxation Oscillator

Figure 3:
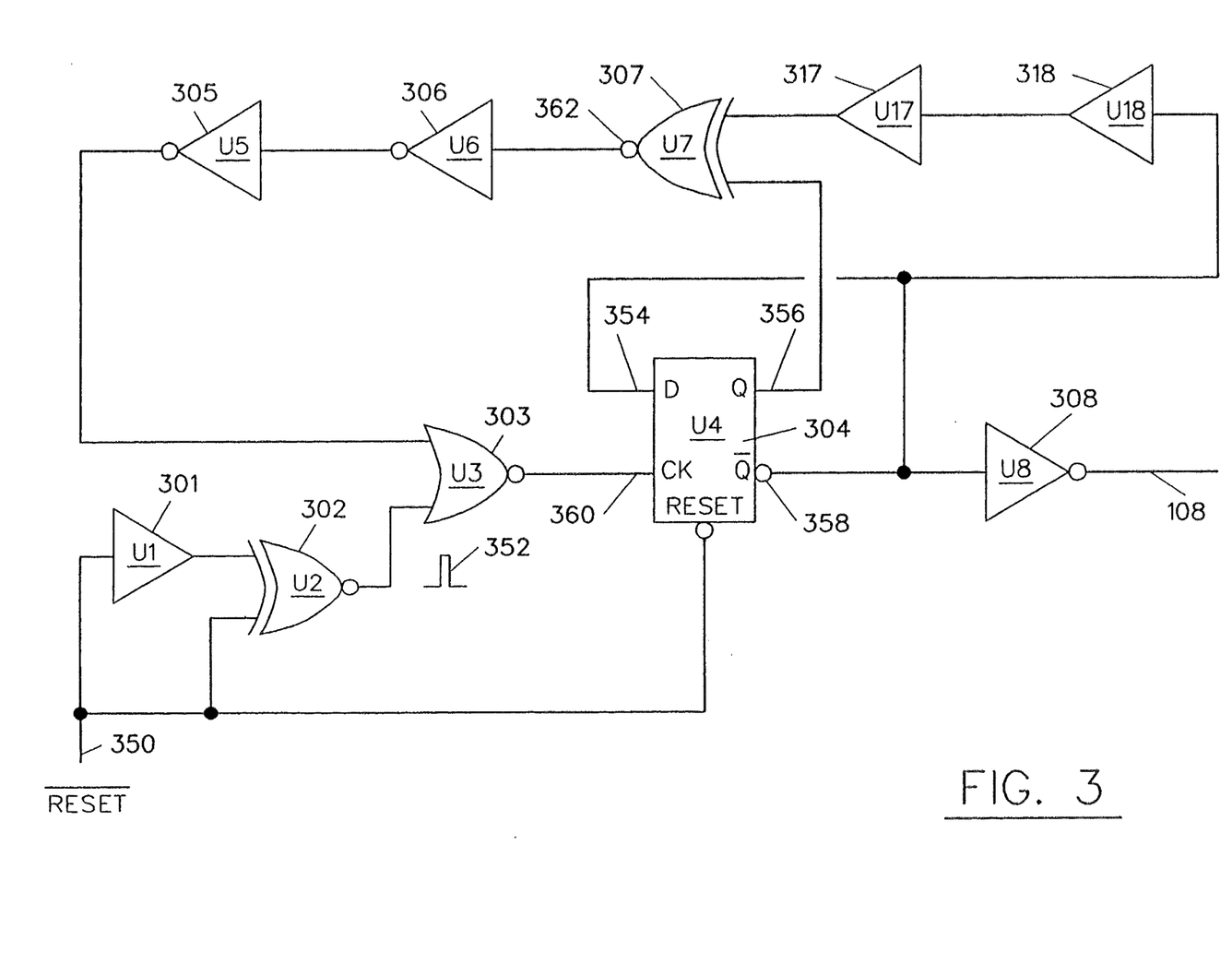
FIG. 3 is a schematic diagram of a relaxation oscillator of the present invention.

Referring to FIG. 3, a schematic diagram of a digital logic embodiment of the relaxation oscillator 102 (FIGS. 1 and 2) is illustrated. The relaxation oscillator 102 consists of D flip-flop 304; buffers 301, 317 and 318; inverting buffers 305,306 and 308; exclusive OR ("XOR") gate 302; exclusive NOR ("XNOR") gate 307; and NOR gate 303. The relaxation oscillator 102 may be fabricated on the semiconductor die with the same type of transistors that are used for the other circuits thereof.

A reset signal 350 is normally in the logic high or logic "1" state and connects to the input of buffer 301, one input of the XOR gate 302 and the reset input of the flip-flop 304. To initialize the relaxation oscillator 102, the reset signal 350 is briefly brought to a logic low or logic "0" state, then returned to its normally high state. Upon return of the reset signal 350 to a logic 1, a pulse 352 is generated at the output of the XOR gate 302. The pulse 352 is substantially the width in time of the delay introduced by buffer 301 because the XOR gate 302 only outputs a logic 1 when both of its inputs are of different logic states.

Flip-flop 304 is reset by the reset signal 350 to a known state, for example, the Q output at logic 0 and the Q-bar output 358 at logic 1. The output of the NOR gate 303 is connected to the clock input 360 of flip-flop 304. The pulse 352 causes the output of the NOR gate 303 to go to a logic 0 then to a logic 1 which causes the flip-flop 304 to transfer the logic value at its D input 354 to its Q output 356. The logic level at the D input 354 is the value of the Q-bar output 358 which is the opposite logic level of the Q output 356. Thus, the Q output 356 changes logic states every time a pulse is received at the clock input 360.

The Q output 356 connects to an input of the XNOR gate 307. The other input of the XNOR gate 307 connects to an output of series connected buffers 317 and 318. The input of buffer 318 connects to the Q-bar output 358. The output of the XNOR gate 307 is at a logic 0 whenever its inputs are at different logic levels. Normally, the Q output 356 and Q-bar output 358 are at different logic levels, however, these outputs change state every clock input 360. During this transition, the Q-bar output 358 logic level change is delayed to the input of the XNOR gate 307 by the series connected buffers 317 and 318. This delay causes the same logic level to briefly exist on both the inputs of the XNOR gate 307. When both inputs of the XNOR gate 307 are the same, the output 362 of the XNOR gate 307 goes to a logic 1.

The output 362 is delayed through inverting buffers 305 and 306. The output of inverting buffer 305 is connected to an input of the NOR gate 303. Whenever at least one input of NOR gate is at a logic 1, its output will be at logic 0. The NOR gate input is connected to the output of XOR gate 302 which is normally at logic 0 unless the reset signal 350 is asserted. Therefore, whenever both inputs of NOR gate 303 are at logic 0, its output will go to a logic 1. The NOR gate 303 output is connected to the clock input 360 of flip-flop 304. Inverting buffer 308 is utilized to buffer the oscillator output 108 and is connected to the count input of the gated counter 104 (FIG. 2).

The above described circuit is a relaxation oscillator that has a frequency determined by the natural speed of the silicon in the environment in which it is fabricated and is additionally influenced by the associated connection path delays due to layout capacitance. The above circuit illustrated in FIG. 3 will oscillate at different frequencies depending on the environmental conditions such as temperature and voltage, and will indicate the relative performance of which the silicon die is capable.

Gated Counter

Figure 4:
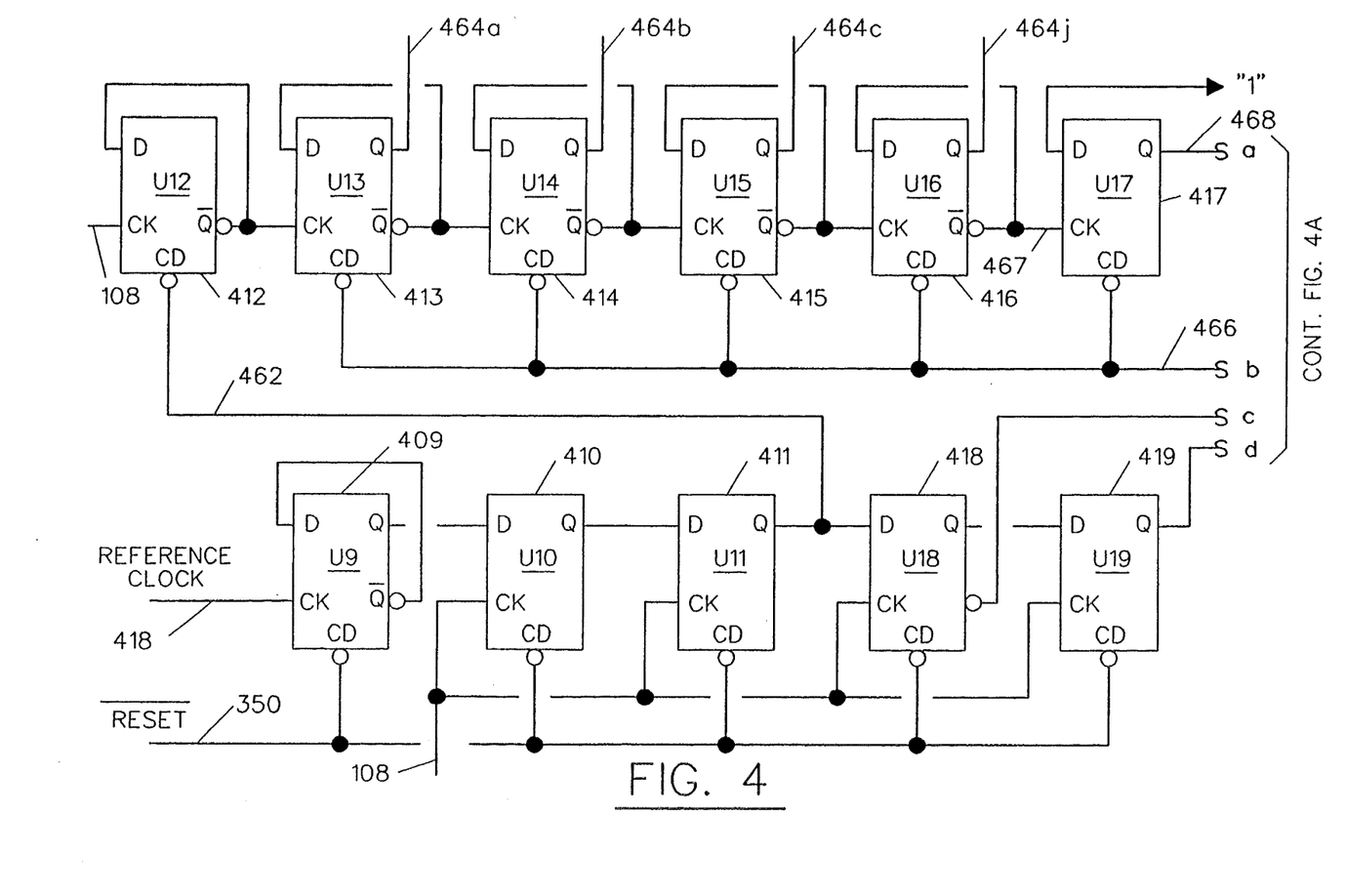
FIGS. 4 and 4A are schematic diagram of a gated counter and decision circuit of the present invention.
Figure 4A:
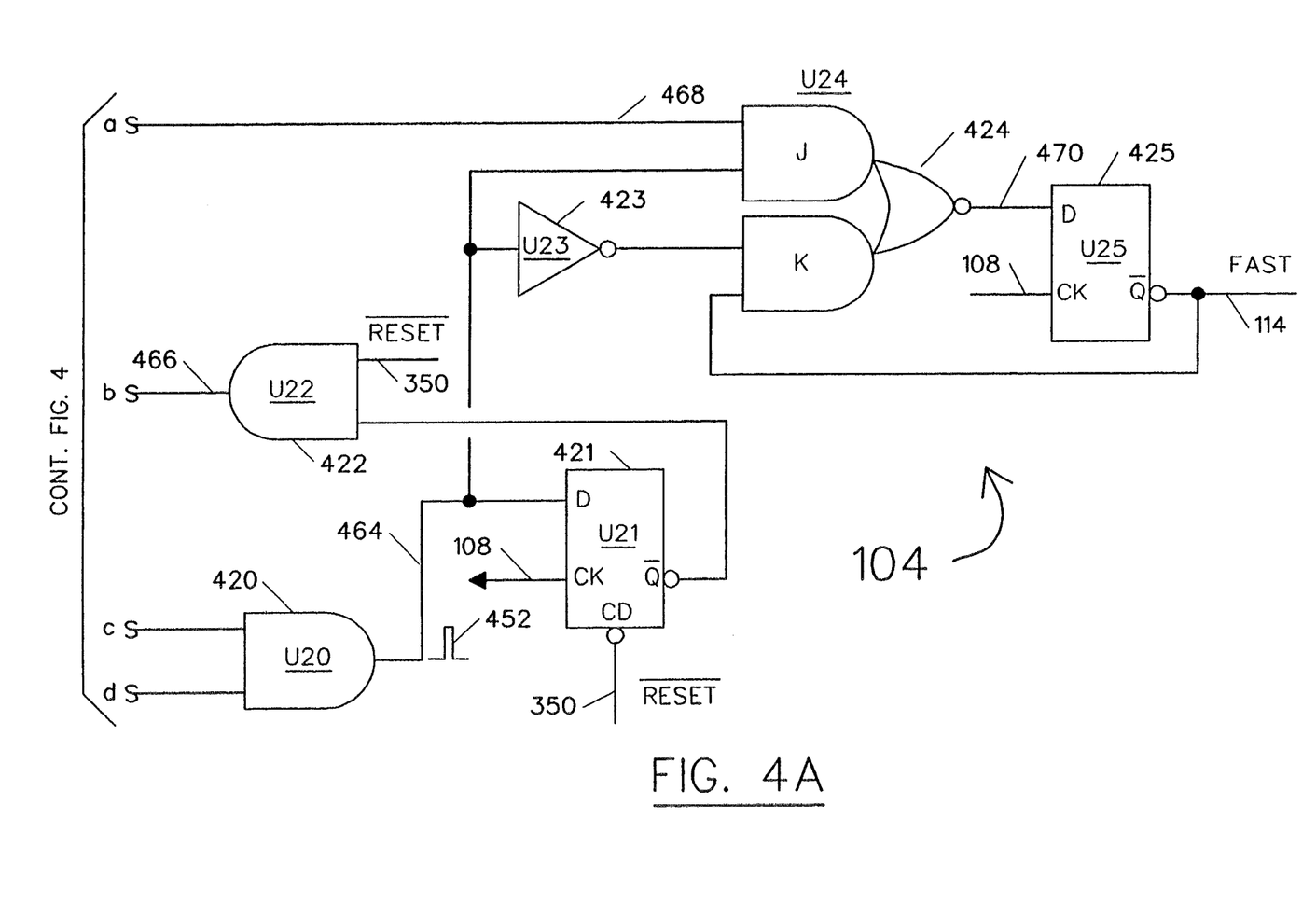

The gated counter 104 is utilized for quantizing the ratio of the relaxation frequency (oscillator output 108) and the reference clock output 218. Referring now to FIGS. 4 and 4A, a schematic diagrams of a preferred embodiment of a digital logic circuit for the gated counter 104 are illustrated. The gated counter 104 consists of D flip-flops 409 through 419, 421 and 425; AND gates 420 and 422; inverting buffer 423; and AND/OR-/INVERT gate 424.

The gated counter 104 quantizes the ratio of the relaxation oscillator output 108 and the reference clock output 218 by periodically counting the oscillator output 108 in flip-flops 412 through 416 which are connected as a ripple counter that counts over a controlled period of time. The controlled period of time may be one period of the reference clock output 218. Normally, the relaxation frequency will be 20 to 32 times the reference clock frequency, however, if the ratio is small, i.e., the relaxation frequency is only two or three times the reference clock frequency, more granularity and resolution may be obtained by having the controlled time period extend over multiple periods of the system clock frequency.

For example, the reference clock output 218 is a constant 10 MHz, having a period of 100 nanoseconds, and the relaxation frequency (oscillator output 108)

varies in frequency from about 200 to 320 MHz as a result of circuit layout, voltage and temperature conditions, etc. Consequently, the ratio between the relaxation and reference frequencies will be from 20 to 32. Thus, five ripple counters comprised of D flip-flops 412 through 416 record the ripple count to a maximum of 32 during the count enable period of the reference clock output 218.

Initially D flip-flop 412 is held reset by a logic 0 on the output of D flip-flop 411. Flip-flops 409, 410, 411, 418 and 419 are reset when the reset signal 350 is at logic 0 and enabled when reset signal 350 is at logic 1. Flip-flop 409 changes its output state on every reference clock output 218 pulse, i.e., the Q output is at logic 1 for one reference clock 216 period and at logic 0 for the next clock period 216. When the Q output of flip-flop 409 is at logic 1, flip-flop 410 shifts a logic 1 to its output upon a pulse from the oscillator output 108. A logic 1 is similarly shifted to the output of flip-flop 411 on the next oscillator output 108 pulse. The flip-flops 410 and 411 are utilized to synchronize the Q output of flip-flop 409 to the higher speed relaxation oscillator output 108. In addition, the flip-flops 410 and 411 eliminate the potential for metastability by delaying the reset/enable signal 462 by two oscillator output 108 pulses.

The clock input of flip-flop 412 is connected to the relaxation oscillator output 108 and causes the Q and Q-bar outputs to toggle at every oscillator output 108 pulse. The flip-flop 412, however, will not toggle whenever its reset is at a logic 0. Thus, flip-flop 412 is controlled by the Q output of flip-flop 411, and only is allowed to toggle during alternate reference clock output 218 periods when the Q output of flip-flop 411 is at logic 1 (reset/enable signal 462).

When the flip-flop 411 reset/enable signal 462 is at a logic 1, the flip-flop 412 Q output toggles each time there is a oscillator output 108 pulse. Whenever the output of flip-flop 412 goes from a logic 0 to a logic 1, flip-flop 413 output toggles. In similar fashion the outputs of flip-flops 414, 415 and 416 toggle whenever the respective clock inputs from a logic 0 to a logic 1.

Every time the Q-bar output of flip-flop 412 goes to a logic 1, the Q-bar output of flip-flop 413 toggles logic state. When the Q-bar output of flip-flop 413 goes to a logic 1, then flip-flop 414 toggles its Q-bar output logic state. In similar fashion, the outputs of the flip-flops 415 and 416 toggle or "count". In this manner flip-flops 412 through 416 ripple count the number of oscillator output 108 pulses during a period of the reference clock output 218. The four most significant bits of the quantized number of oscillator output 108 pulses may be read from the Q outputs 464a through 464d.

The binary value on the Q outputs 464 may be parallel loaded into a storage register (not illustrated) just before flip-flops 413 through 416 are reset by signal 466 from the AND gate 422. Flip-flop 417 is used to capture a count greater than 32. The Q output of flip-flop 417 becomes a logic 1 when signal 467 goes from a logic 0 to a logic 1. Thus, a count in the ripple counters flip-flops 412 through 416 greater than 32 will be retained in the flip-flop 417. The quantized ratio count is maximum just before a logic 0 reset signal 466 from AND gate 422 is received by the flip-flops 413 through 417. The counter Q outputs 464a through 464d may be sent on the output bus 212 (FIG. 2) to the frequency controller 206 and utilized as mentioned above.

Flip-flop 421 is used to control a reset that allows enough time to record the ripple count value without having a race condition. There is some delay between the Q-bar output of flip-flop 418 and the Q output of flip-flop 419. The AND gate 420 detects this delay and produces a pulse 452 on its output. AND gate 420 only produces a logic 1 on its output when both of its inputs are also at logic 1.

There is a pulse 452 only when the Q output of flip-flop 419 is at a logic 1 and the Q-bar output of flip-flop 418 is at a logic 1. Thus, pulse 452 occurs every other reference clock output 218 period and signifies the end of a reference clock 218 period. The pulse 452 is applied to the D input of the flip-flop 421 where it is resynchronized with oscillator output 108, and which clocks it into and inverts it in the Q-bar output of the flip-flop 421. The Q-bar output of flip-flop 421 is connected to one input of the AND gate 422. Whenever either input of the AND gate 422 is at a logic 0, its output is at a logic 0. The output of the AND gate 422, when at logic 0, is utilized to reset flip-flops 413 through 417. The Q-bar output of flip-flop 421 has a pulse width of one period of the oscillator output 108.

Speed Adjustment Control Circuit

In another aspect of the present invention, the speed adjustment control circuit 106 (FIG. 1) may consist of AND/OR/INVERT gate 424 and flip-flop 425 which together form a J-K flip-flop. An input of gate 424 is connected to the Q output of flip-flop 417. When the Q output of flip-flop 417 is at a logic 1, there is a high count signal 468 representing a relaxation oscillator output 108 of higher frequency. This high count is the high ratio signal 112 of FIG. 1 and is indicative of a silicon die having fast propagation. The Q-bar output of flip-flop 425 is set to a logic 1 on the next oscillator output 108 after a logic 0 is applied from the output of gate 424 to signal line 470 which is connected to the D input of the flip-flop 425.

The flip-flop 425 loads the logic value of signal 468 when pulse 452 is a logic 1 and oscillator output 108 goes to logic 1. In this way, the speed adjustment output 114 retains whether the relaxation oscillator 102 is running fast or slow depending on what ratio is determined by the ripple counter (flip-flops 412–416). The speed adjustment output 114 may be utilized to indicate whether the semiconductor die is running fast or slow by indicating either a logic 1 or 0, respectively. The speed adjustment output 114 may also be utilized to control changing the speed of the system clock (not illustrated) to the most advantageous speed for operating the semiconductor die under its presently indicated condition or to adjust delay timing to meet interface setup and settling requirements.

The number of ripple counter flip-flops may be selected to cover the anticipated relaxation oscillator frequency range of ratio quantization values. This range of ratio quantization values may be determined by computer design simulation based on the timing models of the primitives used for the relaxation oscillator 102.

One skilled in the art of digital circuit design and microprocessors will readily appreciate that running a microprocessor as fast as possible results in the most powerful software performance of a computer system. Having to constrain the speed of the microprocessor to artificially lower speeds so as to insure reliable performance at worst-case conditions is both wasteful and unnecessary when utilizing the present invention.

The present invention enables implementing a self-compensating system clock that can effectively maintain constant efficiency of the digital logic being evaluated by the quantized ratio of the relaxation frequency to system clock frequency. Maintaining a fixed ratio keeps the system efficiency constant throughout all operating conditions and parameters.

A simple decision circuit may also be easily implemented on a semiconductor die for determining whether fast or slow operation is appropriate. Fast operation may be used when the semiconductor die can reliably operate in a fast mode, and slow operation may be used when reliable operation in the fast mode is not possible.

Figure 5:
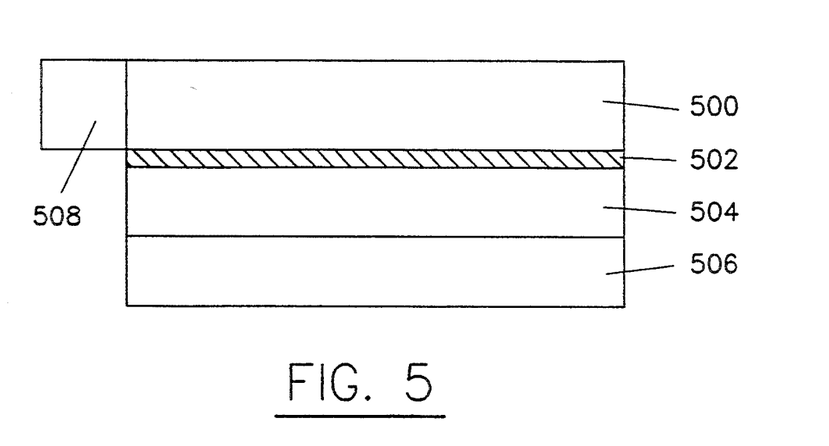
FIG. 5 is a schematic elevational view of an embodiment of the present invention utilizing a thermoelectric heat pump.

When maintaining optimal speed and performance is critical, the temperature of the semiconductor die may be kept at an optimal temperature by means of a heat pump. Referring now to FIG. 5, a schematic elevational view of a heat pump system of the present invention is illustrated. A semiconductor die is in close thermal communication with a thermoelectric heat pump 504. The die 500 may be attached to the heat pump 504 with thermally conductive epoxy 502 or other means well known to those in the art of semiconductor packaging. A heat sink 506 is attached to, and takes heat from or supplies heat to, the heat pump 504 as necessary.

The heat pump 504 may be, for example, a thermoelectric (Peltier) heat pump manufactured by Material Electronic Products Corporation ("Melcor"). The Melcor Frigichip TM heat pump 504 is a solid state thermoelectric heat pump that utilizes the Peltier effect to perform both cooling and heating functions. A more detailed description of a suitable heat pump device is available in Melcor literature, and the Melcor literature is incorporated by reference herein for all purposes. Heat sinks are well known to those skilled in the electronic arts.

Figure 6:
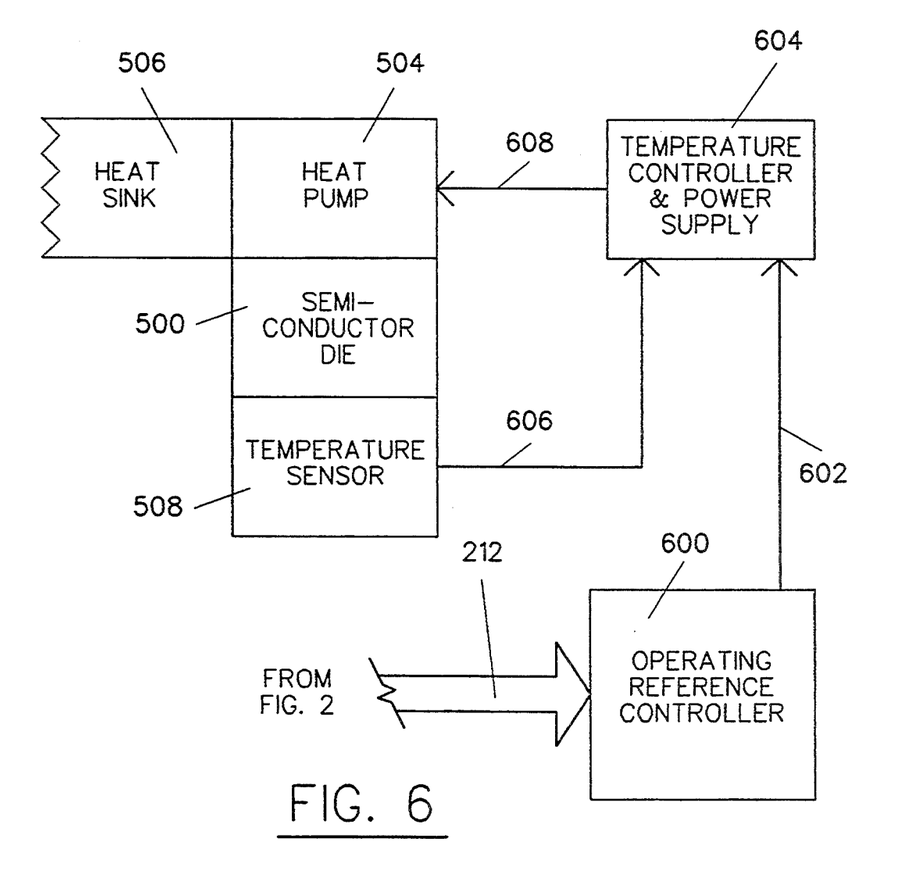
FIG. 6 is a schematic block diagram of a control system for the heat pump embodiment of FIG. 5.

Referring now to FIG. 6, a schematic block diagram of a control system for maintaining the temperature of the semiconductor die is illustrated. The heat pump 504 is powered and controlled by signal 608 from temperature controller 604. The temperature controller 604 receives the die 500 temperature information 606 from the temperature sensor 508. A set point signal 602 from an operating reference controller 600 determines the preferred temperature at which the die 500 operates.

The reference controller 600 obtains the quantized ratio indicating the operating performance of the die 500 from the output bus 212 (FIG. 2). From this information, the reference controller 600 determines the optimal operating temperature of the die 500 and transmits same to temperature controller 604 by means of the set point signal 602. In this way, the temperature of the die 500 is maintained at a substantially optimum operating point.

The present invention may be utilized to maintain proper setup and hold time on a receiving interface, proper timing of output data, correct timing of direct pass through of data, and for taking full advantage of the computational power of the device. Dynamically evaluating the performance of the semiconductor device allows the design engineer to implement a design based upon "best-case" device parameters not "worst-case" device parameters as was heretofore required to insure reliability over all operating conditions. This is especially significant in data communications systems.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. An apparatus for determining the optimal operating speed of a semiconductor die, comprising:
   a relaxation oscillator disposed on the semiconductor die and operating at a natural frequency thereof;
   a reference clock operating at a reference frequency;
   means for calculating a ratio of the relaxation oscillator frequency and the reference clock frequency; and
   means for determining a system clock frequency from the ratio at which the semiconductor die operates in substantially the most efficient and reliable manner.

2. The apparatus of claim 1, wherein the semiconductor die is a plurality of semiconductor dice each having a relaxation oscillator disposed on each semiconductor die and operating at a natural frequency thereof and means for calculating ratios of each of the relaxation oscillator frequencies and the reference clock frequency.

3. An apparatus for optimizing operating speed of a semiconductor die, comprising:
   a relaxation oscillator having a frequency output, said oscillator disposed on the semiconductor die and operating at a natural frequency thereof;
   a system clock operating at a system clock frequency and having selectable fast and slow speeds, both speeds lower in frequency than the relaxation oscillator frequency;
   a reference clock having a reference output frequency;
   a gated counter having clock and gate inputs, said gated counter having a storage register for storing and outputting a signal indicating either a low or a high count in said counter;
   said gated counter clock input connected to said relaxation oscillator output;
   said gated counter gate input connected to said reference clock;
   said gated counter determining a ratio by counting the number of cycles of the relaxation oscillator frequency during at least one period of the reference clock frequency;
   said gated counter outputting a high count signal to said storage register if the ratio is greater than a predetermined value; and
   said storage register output controlling the selection of said system clock speed so that a fast clock speed is selected when there is a high count in said storage register.

4. The apparatus of claim 3, wherein said gated counter comprises a plurality of flip-flops connected as a ripple counter.

5. The apparatus of claim 3, wherein said storage register is a flip-flop that retains the value of the last finished count until a new finished count is available.

6. An apparatus for optimizing the operating speed of a semiconductor die, comprising:
   a relaxation oscillator having a frequency output, said oscillator disposed on the semiconductor die and operating at a natural frequency thereof;

a system clock operating at a system clock frequency and having a plurality of selectable speeds, all lower in frequency than the relaxation oscillator frequency;

a system clock speed controller, said controller selecting the speed of said system clock;

a reference clock having a reference output frequency;

a gated counter having clock and gate inputs and having an output;

said gated counter clock input connected to said relaxation oscillator output;

said gated counter gate input connected to said reference clock;

said gated counter determining a ratio by counting the number of cycles of the relaxation oscillator frequency during at least one period of the reference clock frequency; and said gated counter output connected to said speed controller and outputting the ratio so that said speed controller may determine an optimal system clock speed.

7. The apparatus of claim 6, wherein said system clock is a phase-lock-loop controlled frequency selectable oscillator.

8. The apparatus of claim 6, wherein said system clock is generated by direct digital synthesis.

9. The apparatus of claim 6, wherein said system clock consists of a high frequency oscillator divided down in frequency by a selectable frequency divider.

10. A method for optimizing the operating speed of a semiconductor die, comprising the steps of:

generating a frequency with a relaxation oscillator disposed on the semiconductor die and operating at a natural frequency thereof;

determining the frequency of the relaxation oscillator;

determining the frequency of a reference oscillator;

calculating a ratio of the relaxation oscillator and reference oscillator frequencies; and selecting a system clock frequency from the calculated ratio, wherein the semiconductor die operates in substantially the most efficient and reliable manner.

11. The method of claim 10, further comprising the step of selecting a first system clock frequency when the calculated ratio is equal to or greater than a certain value and selecting a second system clock frequency when the calculated ratio is less than the certain value, wherein the first system clock frequency is higher than the second frequency.

12. The method of claim 10, further comprising the step of selecting from a plurality of system clock frequencies based on the calculated ratio.

13. A method for testing the speed at which a semiconductor die can reliably operate, comprising the steps of:

generating a frequency with a relaxation oscillator disposed on the integrated circuit die and operating at a natural frequency thereof;

counting the number of cycles of the relaxation oscillator frequency during at least one period of a reference clock frequency so that a ratio is determined between the relaxation oscillator frequency and the reference clock frequency; and outputting the ratio so that a maximum reliable operating speed of the integrated circuit may be determined.

14. A system for testing the speed at which a semiconductor die can reliably operate, said system comprising:

a semiconductor integrated circuit die having a relaxation oscillator disposed thereon and operating at a natural frequency thereof;

a frequency counter connected to the relaxation oscillator and determining the frequency thereof; and a lookup table for determining the maximum reliable operating speed of the semiconductor integrated circuit die from the relaxation oscillator frequency.

15. The system of claim 14, further comprising circuit logic to calculate a ratio between the relaxation oscillator frequency and another selected frequency.

16. The system of claim 15, wherein the other selected frequency is a reference clock frequency.

17. A system for testing the speed at which a semiconductor die can reliably operate, said system comprising:

a semiconductor integrated circuit die having a relaxation oscillator disposed thereon and operating at a natural frequency thereof;

a system clock having a plurality of selectable frequencies, all lower in frequency than the relaxation oscillator;

a reference clock having a reference output frequency;

a gated counter having clock and gate inputs and having an output;

said gated counter clock input connected to said relaxation oscillator;

said gated counter gate input connected to said reference clock;

said gated counter counting the number of cycles of the relaxation oscillator frequency during at least one period of the frequency of said reference clock so that a ratio is determined between the relaxation oscillator frequency and the reference clock frequency; and said gated counter output outputting the ratio so that a maximum reliable operating speed of the semiconductor die may be determined from the ratio.

18. An apparatus for maintaining an optimal temperature of a semiconductor die, comprising:

a relaxation oscillator disposed on the semiconductor die and operating at a natural frequency thereof;

a frequency counter for calculating the frequency of said relaxation oscillator;

a temperature sensor in thermal communication with the semiconductor die for determining the temperature thereof;

a heat pump in thermal communication with the semiconductor die for maintaining the die at a certain temperature;

a temperature controller connected to the temperature sensor and heat pump, said temperature controller controlling the temperature of the semiconductor die to substantially the certain temperature; and a means for determining the certain temperature from the frequency of said relaxation oscillator, wherein at that certain temperature the semiconductor die operates in substantially the most efficient and reliable manner.

19. The apparatus of claim 18, wherein said heat pump is a thermoelectric heat pump, said thermoelectric heat pump between the semiconductor die and a heat sink, and in thermal communication therewith.

20. A method for maintaining an optimal operating temperature of a semiconductor die, comprising the steps of:
  generating a frequency with a relaxation oscillator disposed on the semiconductor die and operating at a natural frequency thereof;
  determining the frequency of the relaxation oscillator;
  measuring the temperature of the semiconductor die;
  calculating a certain temperature from the measured temperature of the semiconductor die and frequency of the relaxation oscillator; and
  controlling the temperature of the semiconductor die to substantially the certain temperature, wherein the semiconductor die operates at substantially the most efficient and reliable operating temperature.

21. An apparatus for adjusting interface timing parameters so as to maintain compatibility between different types of semiconductor devices during setup and hold times, comprising:
  a relaxation oscillator disposed on the semiconductor die and operating at a natural frequency thereof;
  a reference clock operating at a reference frequency;
  means for calculating a ratio of the relaxation oscillator frequency and the reference clock frequency; and
  means for determining system timing parameters from the ratio so that semiconductor devices having different setup and hold time requirements are compatible.

22. A method for adjusting interface timing parameters so as to maintain compatibility between different types of semiconductor devices during setup and hold times, comprising the steps of:
  generating a frequency with a relaxation oscillator disposed on the semiconductor die and operating at a natural frequency thereof;
  determining the frequency of the relaxation oscillator;
  determining the frequency of a reference oscillator;
  calculating a ratio of the relaxation oscillator frequency and the reference clock frequency; and
  determining system timing parameters from the ratio so that semiconductor devices having different setup and hold time requirements are compatible.

* * * * *